(12) United States Patent
Scorsi et al.

(10) Patent No.: US 8,144,828 B2
(45) Date of Patent: Mar. 27, 2012

(54) COUNTER/TIMER FUNCTIONALITY IN DATA ACQUISITION SYSTEMS

(75) Inventors: Rafael Castro Scorsi, Round Rock, TX (US); Brian Keith Odom, Georgetown, TX (US)

(73) Assignee: National Instruments Corporation, Austin, TX (US)

(*) Notice: Subject to any disclaimer, the term of this patent is extended or adjusted under 35 U.S.C. 154(b) by 203 days.

(21) Appl. No.: 12/534,785

(22) Filed: Aug. 3, 2009

(65) Prior Publication Data

US 2011/0026664 A1    Feb. 3, 2011

(51) Int. Cl.
H03K 21/00 (2006.01)
G11C 19/00 (2006.01)
(52) U.S. Cl. ............................. 377/27; 377/54
(58) Field of Classification Search .................. None
See application file for complete search history.

(56) References Cited

U.S. PATENT DOCUMENTS

| | | | | |
|---|---|---|---|---|
| 4,383,433 A | * | 5/1983 | Stacy | 73/23.4 |
| 5,539,306 A | * | 7/1996 | Riggio, Jr. | 324/158.1 |
| 5,842,006 A | * | 11/1998 | Harvey et al. | 713/502 |
| 6,157,695 A | * | 12/2000 | Barna | 377/52 |
| 2005/0234665 A1 | * | 10/2005 | Nakano | 702/66 |
| 2008/0043826 A1 | * | 2/2008 | Castro et al. | 375/224 |
| 2011/0029101 A1 | | 2/2011 | Castro et al. | |
| 2011/0029691 A1 | | 2/2011 | Scorsi et al. | |

OTHER PUBLICATIONS

U.S. Appl. No. 12/753,651; filed Apr. 2, 2010; "Synchronization of Converters Having Varying Group-Delays in a Measurement System"; Adam H. Dewhirst and Rafael Castro Scorsi; 41 pages.

* cited by examiner

*Primary Examiner* — Tuan T Lam
(74) *Attorney, Agent, or Firm* — Meyertons Hood Kivlin Kowert & Goetzel, P.C.; Jeffrey C. Hood

(57) ABSTRACT

A counter module may include a first set of registers configured to store respective sets of first control data, a second set of registers configured to store respective sets of second control data, a first counter and a second counter. The first counter may be coupled to the first set of registers and may receive counter input signals and an internal control signal, and generate a first count output and a first terminal count output according to one of the respective sets of the first control data, the internal control signal, and the counter input signals. The second counter may be coupled to the first counter and to the second set of registers, and may receive the counter input signals, generate the internal control signal, and generate a second count output and a second terminal count output according to one of the respective sets of the second control data and the counter input signals. The counter module may also include output control logic configured to generate a timer output based on the first terminal count output and the second terminal count output.

20 Claims, 8 Drawing Sheets

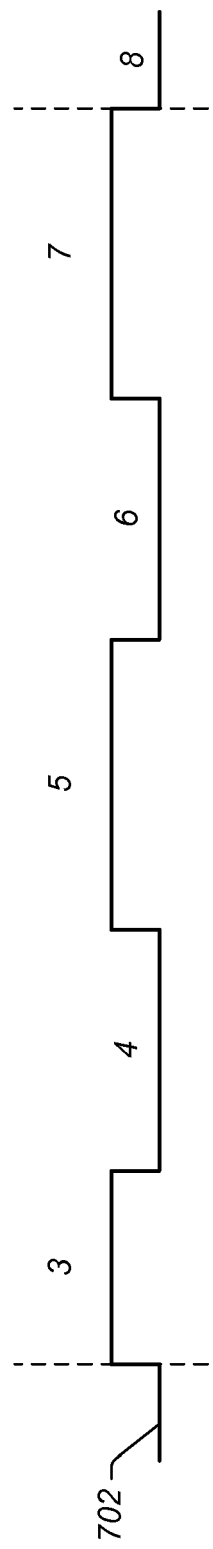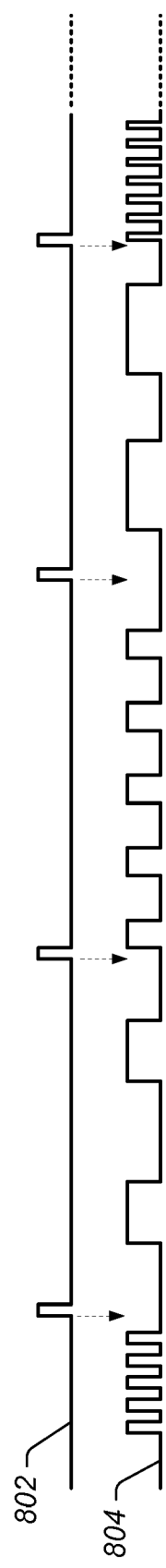

COUNTER/TIMER FUNCTIONALITY IN DATA ACQUISITION SYSTEMS

BACKGROUND OF THE INVENTION

1. Field of the Invention

This invention relates generally to measurement and data acquisition systems and, more particularly, to the improvement of counter functionality in data acquisition systems.

2. Description of the Related Art

Measurement systems are oftentimes used to perform a variety of functions, including measurement of a physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include a Source-Measure Unit (SMU), which may apply a voltage to a DUT and measure the resulting current, or may apply a current to the DUT and measure the resulting voltage.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT. More often than not, DAQ devices also include counter/timer modules for multiple applications. In counter mode, these modules may count external events, perform time related measurements and interface with several types of position measurement sensors. In timer mode, these modules may generate pulses and pulse trains in several different ways. The pulses generated by the modules may be used to control external devices.

Many DAQ devices incorporate one counter and several logic circuits around the counter to make it perform several different functions. This configuration provides sufficient support for some functions, but there are several common functions that may require more than one counter. An example of such a function, or operation is the generation of a finite pulse train. While one counter is needed to count the pulse specifications (how long the pulse should be kept high, and how long the pulse should be kept low), a second counter may be required to count how many pulses have been generated, and stop the first counter when the operation is complete. Another operation that may require more than one counter is frequency measurement. In this case, a first counter may be used to measure the number of periods of the signal of interest (using a sample clock to define the measurement period), while a second counter may be used to measure precisely the time elapsed for that number of periods. The use of two independent counters, however, limits the range of possible solutions, and further improvements are therefore desirable.

Other corresponding issues related to the prior art will become apparent to one skilled in the art after comparing such prior art with the present invention as described herein.

SUMMARY OF THE INVENTION

In one set of embodiments, a counter module may include a first set of registers configured to store respective sets of first control data, a second set of registers configured to store respective sets of second control data, a first counter coupled to the first set of registers, and a second counter coupled to the first counter and to the second set of registers. The first counter may receive counter input signals and an internal control signal, and may generate a first count output and a first terminal count output according to one of the respective sets of the first control data, the internal control signal, and the counter input signals. Similarly, the second count may receive the counter input signals and may generate a second count output and a second terminal count output according to one of the respective sets of the second control data and the counter input signals. The internal control signal may be based on the second terminal count output. The counter module may also include output control logic configured to generate a timer output based on the first terminal count output and/or the second terminal count output.

In one set of embodiments, the first set of registers may be arranged in register banks, each register bank comprising two respective load registers of the first set of registers, with a first register bank of the register banks configured to be written while the first counter is accessing one of two other register banks of the register banks. The first counter may access one of the two other register banks at a time to obtain the one of the respective sets of the first control data. Similarly, the second set of registers may also be arranged in register banks, each register bank comprising two respective load registers of the second set of registers, with a first register bank of the register banks configured to be written while the second counter is accessing one of two other register banks of the register banks. The second counter may access one of the two other register banks at a time to obtain the one of the respective sets of the first control data Each respective set of the first control data and may include a respective first value indicative of a first time period before a first pulse of the first terminal count output, and a respective second value indicative of a second time period before a second pulse of the first terminal count output. Similarly, each respective set of the second control data may include a respective first value indicative of a first time period before a first pulse of the second terminal count output, and a respective second value indicative of a second time period before a second pulse of the second terminal count output. The counter module may include a control block configured to coordinate operation of the first counter and the second counter, by decoding the counter input signals into appropriate control signals for each of the first counter and the second counter in a synchronized manner.

In one set of embodiments, the timer output may be a pulse train, with the first counter controlling generation of the pulse train by first counting the number of pulses of a timer signal (of the counter input signals), from a starting point indicated by a trigger signal to a starting point of the pulse train defined by the one of the respective sets of the first control data, then counting the number of pulses in the second terminal count output, from the starting point of the pulse train to an ending point of the pulse train defined by the one of the respective sets of the first control data.

In one embodiment, the first counter may receive a stream of data comprising data points indicative of respective low time periods during which the timer output should be low and respective high time periods during which the timer output should be high. The first counter may generate the first counter terminal count output according to the data points, while the second counter may count the number of pulses in the first terminal count output, and instruct the first counter to stop generating the first terminal count output when a desired number of data points have been used. The first counter may also receive a stream of data comprising data points, wherein each data point is indicative of a respective low time period during which the timer output should be low and a respective high time period during which the timer output should be high, with the first counter generating the first terminal count output according to a current data point of the data points, and updating the current data point with values of a next one of the data points when instructed by a control signal of the counter input signals. Meanwhile, the second counter may count the number of times the first counter updates the current data point, and instruct the first counter to stop updating the current data point when the first counter has updated the current data point a desired number of times.

In one set of embodiments, one of the counters, for example the first counter may count the number (N) of pulses of a first signal of unknown frequency within a specified first time period, and output as the first count output a first count value indicative of N. Meanwhile, the other counter, for example the second counter may count the number (M) of pulses of a second signal of known frequency within the specified time period, and output as the second count output a second count value indicative of M. The first counter and the second counter may both begin counting at a same first point in time based on a beginning of the specified first time period, and may both stop counting at a same second point in time based on an end of the specified first time period. In one embodiment, the specified time period is defined by a sample clock signal, which may be provided by hardware external to the counter module, hardware configured within the counter module, or software executing on a system comprising the counter module. In one set of embodiments, the first point in time may defined by either a rising edge of the first signal subsequent to the beginning of the specified first time period, or a falling edge of the first signal subsequent to the beginning of the specified first time period. Similarly, the second point in time may be defined by a rising edge of the first signal subsequent to the end of the specified first time period, or a falling edge of the first signal subsequent to the end of the specified first time period. In another set of embodiments, the second point in time may be defined by a rising edge of the first signal immediately preceding the end of the specified first time period, or a falling edge of the first signal immediately preceding the end of the specified first time period.

In one set of embodiments, the output control logic within the counter module may include a resynchronization circuit configured to emulate operation of a circuit running on an external clock source, with a faster internal clock source.

In one set of embodiments, the counter module may be configured with two counters capable of controlling each other in a highly synchronized manner. The counter module may include a first set of registers configured to store respective sets of first control data, a second set of registers configured to store respective sets of second control data, and may further include a first counter and a second counter. The first counter may be coupled to the first set of registers, and may receive counter input signals and a first internal control signal. The first counter may generate a first counter output and a first terminal count output according to one of the respective sets of the first control data, the first internal control signal, and the counter input signals. The second counter may be coupled to the first counter and to the second set of registers, and may receive the counter input signals and a second internal control signal. The second counter may generate a second counter output and a second terminal count output according to one of the respective sets of the second control data, the second internal control signal, and the counter input signals. The first control signal may be based on the second terminal count output, and the second control signal may be based on the first terminal count output. The counter module may also include output control logic configured to generate a timer output based on the first terminal count output and/or the second terminal count output.

In one set of embodiments, the counter module may also include a data stream delivery circuit configured to deliver a control data stream to the first counter and to the second counter. The first counter may generate the first counter output and the first terminal count output according to the first internal control signal, the counter input signals, and first data received through the control data stream. Similarly, the second counter may generate the second counter output and the second terminal count output according to the second internal control signal, the counter input signals, and second data received through the control data stream. The data stream delivery circuit may include a direct memory access (DMA) module configured to transfer the control data stream, and a first-in-first-out buffer coupled to the DMA module, to the first counter, and to the second counter, and configured to buffer the first data and the second data received through the control data stream. A selection circuit may be coupled between the FIFO buffer and the first counter, and between the FIFO buffer and the second counter, to route the first data to the first counter and the second data to the second counter.

BRIEF DESCRIPTION OF THE DRAWINGS

The foregoing, as well as other objects, features, and advantages of this invention may be more completely understood by reference to the following detailed description when read together with the accompanying drawings in which:

FIG. 7 shows a timing diagram of a finite pulse train generated using one embodiment of an integrated counter module that is receiving a control data stream;

FIG. 8 shows a timing diagram of changing PWM signals generated using one embodiment of an integrated counter module that is receiving a control data stream;

Figure 1:
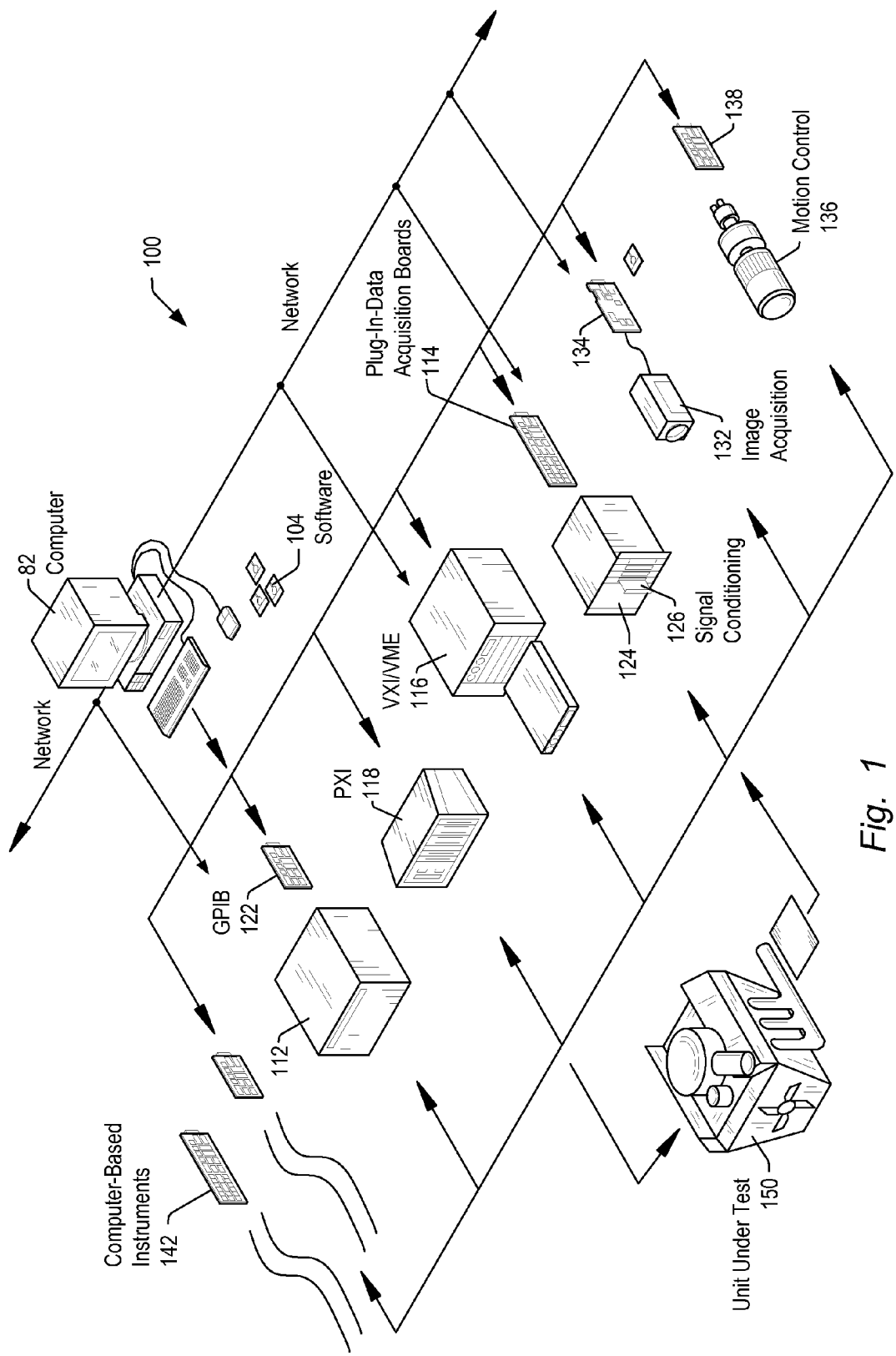
FIG. 1 shows an instrumentation control system with instruments networked together according to one set of embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

As used herein, "sample clock method" references various methods that use a sample clock as a user provided signal that allows all timing operations to be sampled/trigged coherent with analog input, analog output, and digital input/output (I/O) operations. The sample clock may be shared between multiple subsystems on a single peripheral device, such as a data acquisition (DAQ) module, or multiple different peripheral modules, allowing them to take coherent measurements or actions.

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
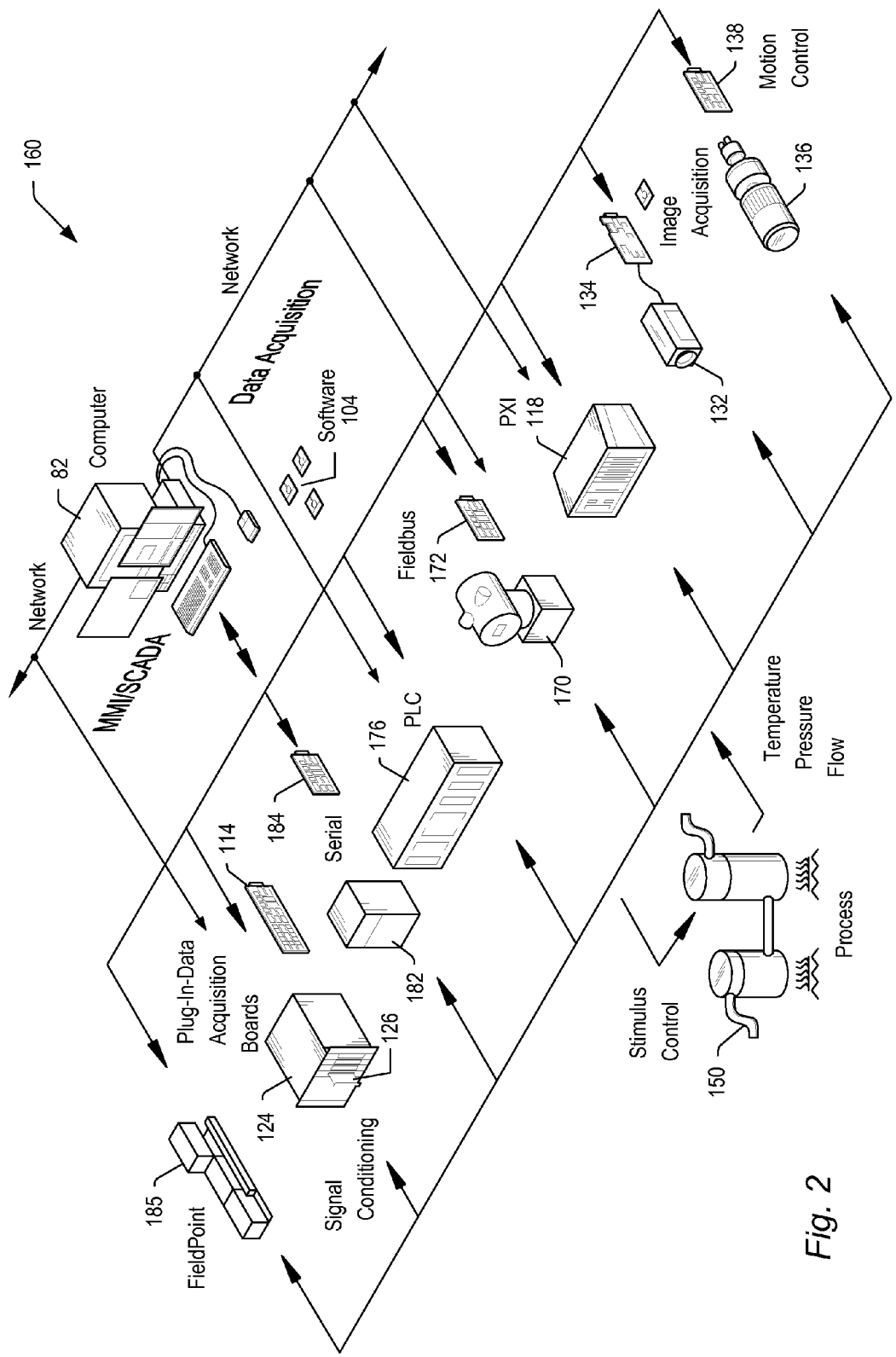
FIG. 2 shows an industrial automation system with instruments networked together according to one set of embodiments.

FIG. 2 illustrates an exemplary industrial automation system 160 that may be configured according to embodiments of the present invention. Industrial automation system 160 may be similar to instrumentation or test and measurement system 100 shown in FIG. 2A. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In one set of embodiments, data acquisition (for example through the use of plug-in DAQ devices 114) may be performed according to a general hardware-timed single point (HTSP) method. This method may involve at least one input component with one output component sharing a CPU-independent clock (HW-timed). The data sent to the output component during any given sample clock period may be generated as a function of the data acquired with the input component during the previous sample clock period. Therefore, the data may be generated one sample at a time (single point) and may not be accumulated in a first-in-first-out buffer (FIFO). The CPU may generate the output data using the input data from a first sample clock (i.e. on the rising edge of a first sampling clock period) and send it to the output module before the next sample clock (i.e. a second sampling clock period) takes place. The DAQ board may be configured to identify and report the appropriate errors if these conditions are not met at any time. The board and the CPU may also be configured to take advantage of all the possible resources in order to minimize the time needed to transfer data between each other, optimizing the time that the CPU uses to compute the output data and maximizing the possible sample clock frequency for the system.

A DAQ board or device (e.g. DAQ devices 114) may typically include one or more independent counter modules to perform a variety of applications. Some of these applications may require more than one counter, in which case two independent counter modules from the DAQ board may be paired to operate together to perform those applications. Although this approach may be sufficient to solve several applications, it may still present several drawbacks. One problem is that the paired independent counter modules typically don't share control and synchronization logic, which may severely limit the range of possible solutions. For example, each given counter may be normally designed to have full operating functionality as a single unit, without built-in modes that depend on a second counter directly coupled to the given counter. As a result, there may be no specified modes of operation optimized to solve applications with two counters. In addition, when performing operations that require reading the counters (saving the current count value, or value counted up to that point), there may be no mechanism to save the two counters in a coherent manner. When given the command to perform a save, each counter may execute the command at different times, dependent on the results of its own synchronization logic, resulting in synchronization errors. Furthermore, it may not be possible to coherently perform operations that require updating the action of the counter (for example, loading a new value, or starting/stopping the counter). In addition, having to pair independent counter modules may reduce the number of counter modules that may be available to a user of the DAQ device. For example, if a DAQ device has four counter modules, it may only be capable of performing two individual operations that require two counter modules, using all counter modules in the process.

Therefore, use of one general-purpose counter module to assist another general-purpose counter module may not be efficient. Usually, the tasks required from a second counter may be simple in nature, and the counter module may already include a lot of other logic circuits that may be unused in the application that requires the two counter modules (e.g. circuits to interface with position sensors, FIFO memory etc). Furthermore, such pairing of independent counter modules may not be capable of providing the desired performance. Two general-purpose counters operating together to perform these applications may therefore be less effective than having dedicated logic to perform the same task or tasks. Configuring the counter module with certain dedicated logic may allow optimized connections and bypassing most of the overhead logic required for a counter to operate independently. For example, a general-purpose counter may need to synchronize all its inputs, incurring two-clock-cycle or three-clock-cycle delays, while the dedicated logic may operate without these delays.

In one set of embodiments, dedicated logic, including an auxiliary counter, may be incorporated in a single independent counter/timer module to perform at least the tasks outlined above. The auxiliary (aux) counter may have dedicated modes for the operations that require two counters, and may be disabled for the operations that only require a single counter. The counter/timer module may also be configured to perform additional applications, since the auxiliary counter may have access to operations that may not have been exposed as part of the interface of previous general-purpose independent counters. By configuring a main counter and an auxiliary counter as part of the same functional unit, the two counters may share control and synchronization logic, which may facilitate the implementation of optimized methods for performing two counter operations. By providing direct access for the control logic to both counters, the different states of the operation may change in coherent steps. Sharing synchronization logic may also facilitate methods for saving values on both counters at specified times as well as updating their actions or count values. The counter module may need to take specific actions on both counters, or save the counter data based on events driven by external signals, depending on the operation the counter module is currently performing. Synchronization logic may be configured within the counter module to detect these events and time its response to them. When the two counters within a counter module share the synchronization logic, the same decision (generated by the synchronization logic) may be applied to both counters, resulting in coherent operation of the two counters, and of the counter module as a whole.

Figure 3:
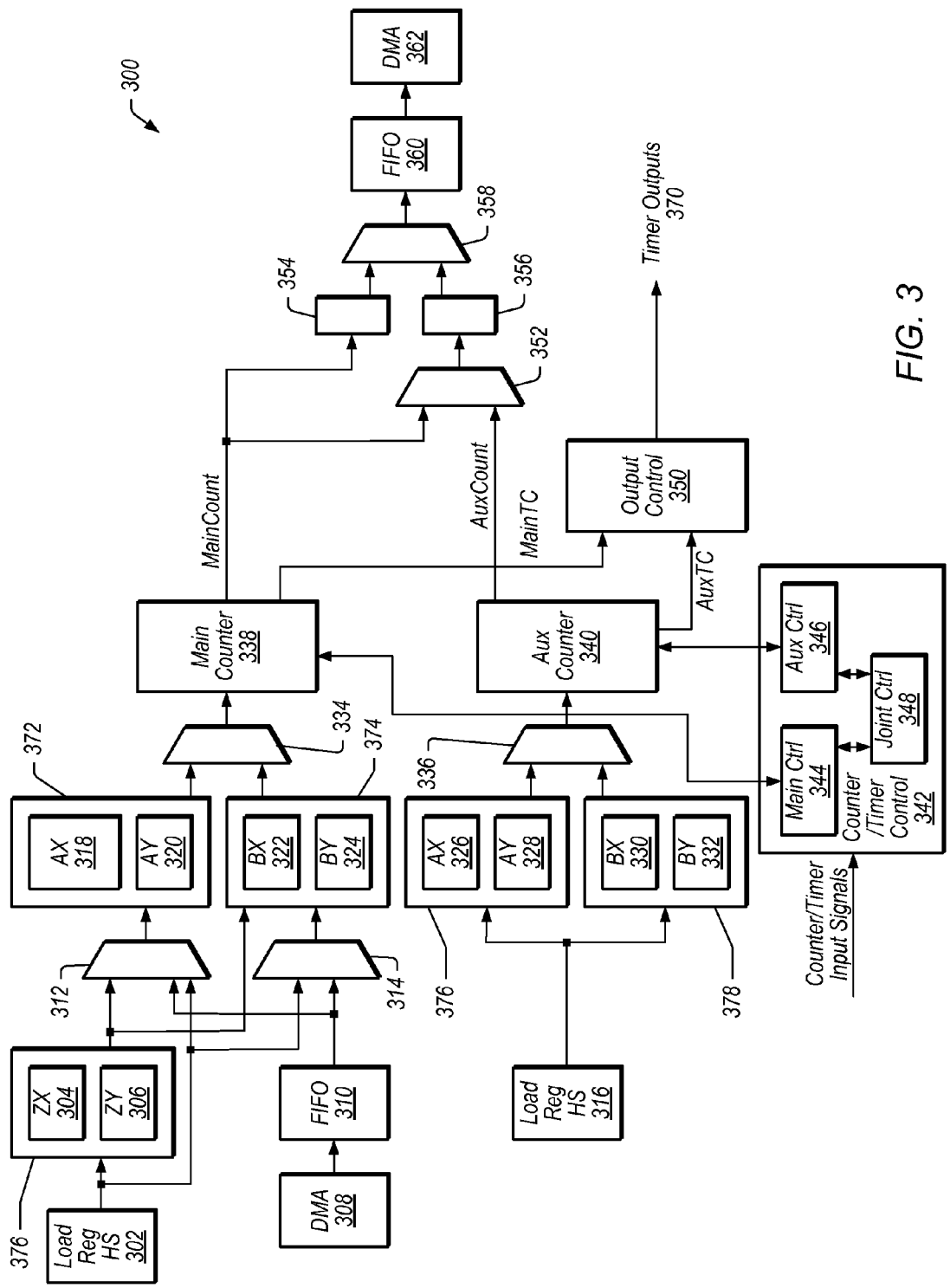
FIG. 3 shows one embodiment of an improved counter within a data acquisition (DAQ) device.

In one set of embodiments, a DAQ board or device (e.g. DAQ device 114) may include one or more counter modules, each counter module including at least two counters and additional logic circuits/blocks configured to form a logical unit that may operate to perform several different functions, as will be further outlined below. FIG. 3 shows one embodiment of a counter module 300 that may perform functions that would have previously required two or more independent counter modules. Counter module 300 may include a main counter 338 and an auxiliary (aux) counter 340, which may share control and synchronization logic as shown, resulting in counters 338 and 340 operating as a single counter (module)

300, leading to improved synchronization and precision in generating timer outputs 370 and signals output to FIFO 360. The structure of counter module 300 may facilitate coherent reading of counters 338 and 340 at specified times, enabling several applications that may not have been possible in previous systems that relied on the use of two independent counter modules. Counter module 300 may further facilitate coherent changing of operation of counters 338 and 340 at specified times, including loading values, and starting or stopping counters 338 and 340.

Counter module 300 may also generate a sample clock usable for all timing operations to be sampled/trigged coherent with analog input, analog output, and digital I/O (input/output) operations. For example, counter module 300 may be configured to perform (buffered or non-buffered) finite pulse train generation, which may include output control circuit 350 generating an initial delay, and initial high pulse and low pulse, and counter units 338 and 340 operating to count time for initial delay and provide terminal counts (TCs) for the rest of the operation. Counter module 300 may also perform finite PWM (pulse width modulated) signal generation, frequency measurement, double event counting, and position and event counting. Counter module 300 may further be used to couple a timing engine with counter operations using a sample clock, and may be reprogrammed based on a stream of data (e.g. via DMA 308 and FIFO 310), which may be interpreted, for example, as high, low, and length commands. Counter module 300 may also be used for synchronizing to asynchronous external sources.

Referring again to FIG. 3, operation of counter module 300 will now be described. In one set of embodiments, main counter 338 may obtain pulse descriptions from SW executing on a host system that includes the peripheral device (e.g. a DAQ device) that includes counter module 300. One example of the SW may be SW executing on signal conditioning system 126 that includes a plug-in DAQ device 114 that may include counter module 300. The pulse descriptions may provide information used by counter 338 to determine how long to count, or to determine the interval between terminal count (TC) signals. A TC signal may be used directly through or it may be used to change the state of timer output 370 through output control block 350. Counter module 300 may be configured to allow for at least two different intervals between TC signals, facilitating the generation of pulses with differing/varying duty cycles. Main counter 338 may generate the TC signals (MainTC), with output control block 350 shaping the outputs based on these settings.

The pulse descriptions (e.g. two different values corresponding to respective time intervals describing the duration of pulses and the time interval between those pulses) may be provided to counter 338 through at least two different delivery methods. As shown in FIG. 3, counter 338 may be coupled to several banks of load registers, such as banks 372, 374, and 376. Each bank may include two load registers to hold the two different values that may describe the pulse train generated using counter 338. For example, bank 372 may include load registers 318 and 320, bank 374 may include load registers 322 and 324, and bank 376 may include load registers 304 and 306. Register load control block 302 may generate the load control signal to load the registers. Main counter 338 may be configured to allow changing the pulse description while it is running, by allowing SW to write bank 374 while main counter 338 is reading from bank 372, and write bank 372 while main counter 338 is reading from bank 374. In one set of embodiments, counter module 300 may be configured to have SW write bank 376 while counter 338 is operating, thereby also allowing SW to write to a bank while counter 338 is switching between banks 372 and 374. The contents of bank 376 may then be moved to the bank that's supposed to hold the pulse descriptions for the next pulse(s).

The pulse descriptions, or pulse train descriptions may also be provided from a FIFO 310 receiving the information through DMA channel 308. Bank 376 and FIFO 310 may be coupled to banks 372 and 374 via selectors (e.g. multiplexers) 312 and 314, respectively. It should also be noted that while not explicitly shown in FIG. 3, DMA 308 and FIFO structure 310 may also be coupled to aux counter 340 in a manner similar to how DMA 308 and FIFO 310 are coupled to main counter 338, to provide means for providing pulse descriptions, or pulse train descriptions to aux counter 340. Accordingly, main counter 338 and aux counter 440 may become fully interchangeable when configuring counter module 300 to perform a variety of functions, and main counter 338 may control aux counter 340 in a manner similar to aux counter 340 controlling main counter 338. Also, in addition to generating the terminal count (TC) pulses (which may also be referred to as TC events), the counters may also provide respective count values to be used by the system. TC events, or TC pulses, as used herein, generally refer to an output generated by either counter upon its having completed a programmed count. Thus, for example, main counter 338 may generate a pulse on its MainTC output upon having completed a count specified, for example, by data obtained from one of load registers 318, 320, etc. Main counter 338 may provide a count value (MainCount) representative of a specific number of pulses or events that main counter 338 has counted, and similarly, aux counter 340 may provide a count value (AuxCount) representative of a specific number of pulses or events that main counter 338 has counted.

In another set of embodiments, main counter 338 may operate in conjunction with aux counter 340, which may be configured as part of the control logic for main counter 338. As shown in FIG. 3, aux counter 340 may also have its own banks of load registers, banks 376 and 378 respectively including load registers 326 and 328, and 330 and 332. Register load control block 316 may generate the load control signal to load the registers. While one of the counters generates pulses or a pulse train, based one the pulse description data, the other counter may be used to count other characteristics such as the number of pulses to be generated, the number of times the pulse description is changed, and/or a time delay from when a trigger is received to when the generation of the pulses or pulse train begins. In many cases a combination of these functions may be programmed. Control block 342 may be configured to coordinate counters 338 and 340 to work together to perform each of these functions, for example by decoding the counter/timer input signals received by control block 342 into appropriate control signals for each of the counters in a synchronized manner. Main control block 344 may be configured to generate a control signal for main counter 338 based for example on the terminal count output of aux counter 340, while aux counter 340 may be configured to generate a control signal for aux counter 340 based for example on the terminal count output of main counter 338. Joint control block 348 may facilitate generating both control signals by communicating with both main control block 344 and aux control block 346. Output control block 350 may be configured to shape the output signals ultimately provided by counter module 300. The output signals of counter module 300 may be generated from either counter 338 or counter 340, or from a combination of the respective output signals of counter 338 and counter 340.

One example of the basic operation of counter module 300 is illustrated by timing diagram 400. Signal 402 may represent the clock frequency of main counter 338, for example, or the pulses that main counter 338 may be counting, also referred to herein as the timer of the counter. Main counter 338 and aux counter 340 may each have their respective timer, or they may share a common timer. Based on information stored in, for example register 318, main counter 338 may count a specified number of pulses of signal 402 to generate the first pulse of output pulse train 404, with the first pulse in signal 406 representing a terminal count indicating that this count has completed. Then, based on information stored in, for example register 320, main counter 338 may count a specified number of pulses of signal 402 to generate the second pulse of output pulse train 404, with the second pulse in signal 406 representing a terminal count indicating that this second count has completed. Aux counter 340 may equally be configured to generate pulse train (signal) 404 using data stored in registers 326 and 328, and/or registers 330 and 332. In addition to basic functionality, counter module 300 may provide improved performance of other operations, and facilitate additional operations that may not be possible using two independent counters. Some of these operations will now be described in further detail.

Finite Pulse Train Generation

Finite pulse trains, that is, pulse trains of a finite duration may be generated using two independent counters. A first counter may be used to generate a gated continuous pulse train. The gate may provide a mean to start and stop the generation of the pulse train. A second counter may be used to generate a single delayed pulse, which may be coupled to the gate of the first counter to control when to start and stop the pulse train generation. This single pulse may be started by a software command, or by a trigger pulse/signal. The trigger pulse may be re-triggered without SW intervention, and may have two parts. The first part may determine the time period from the trigger's assertion to the initial pulse. The second part may determine the time period during which the other counter may generate the desired number of pulses. However, when using two independent counters, the frequency of the pulse train will determine the number of pulses that may be generated. For example, the slower the frequency of the pulse train, the fewer pulses can be generated, because the counter generating the gating pulse is limited by the number of clock cycles it can count independently of the width of the pulses of the pulse train.

Figure 4:
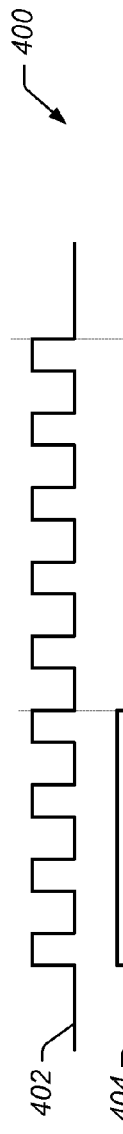
FIG. 4 shows a timing diagram of a pulse train generated using one embodiment of an integrated counter module.

In one set of embodiments, the manner in which the pulse train is generated and gated may be greatly improved. Counters may change their output in response to a given event. A common event may be the terminal count (TC; e.g. the two pulses of signal 406 in FIG. 4). For the output of the counter to change states, the counter may generate a TC event. For finite pulse train generation, following the start trigger, the gating counter may count down to zero to generate a TC that may effectively enable the gating counter's output. This in turn may result in the second counter beginning to count down until its own TC event, in response to which the second counter may affect a change on the pulse train output. However, the minimum time from a start trigger to a change on the pulse train output may be limited by the overhead of two counters generating a TC event, usually the equivalent of a count of two periods of the clock. This may result in a pulse train specification that is not very intuitive. For example, to generate a pulse train in which the idle state of the pulse train is low, an intuitive specification may set the delay from the start trigger to the start of the pulse train, then for the high time of the pulse, and finally for the low time of the pulse. When using two independent counters, the low part of the pulse may have to follow the delay from the start trigger to the pulse train, because once the counter is enabled, it may be required to generate a TC event before it can switch its output. Therefore, the time period from the start trigger to when the signal goes high may actually be the delay from start to pulse train plus the low part of the pulse.

In one set of embodiments, one of the counters, for example aux counter 340 may be configured to generate the pulse train, and the other counter, in this case main counter 338 may be configured to generate a gating pulse. The limitation present when using two independent counters may be eliminated by main counter 338 counting time (i.e. counting pulses of the timer) from the trigger pulse to the start of the pulse train (to be generated), then switching to counting terminal counts generated by aux counter 338 (instead of counting clock pulses of the timer). This may facilitate the generation of the same number of pulses regardless of the period of the pulse train, because aux counter 340 may be integrated as part of the control logic of main counter 338. In addition, taking advantage of the tight coupling between aux counter 340 and main counter 338 and the related logic, main counter 338 and aux counter 340 may be designed to switch their respective outputs on at least two events: the TC and the enabling of the gate signal. Each counter may therefore have the capability to switch its output as soon as the time from the start trigger to the beginning of the pulse train has elapsed, removing the need of the TC event.

Figure 5:
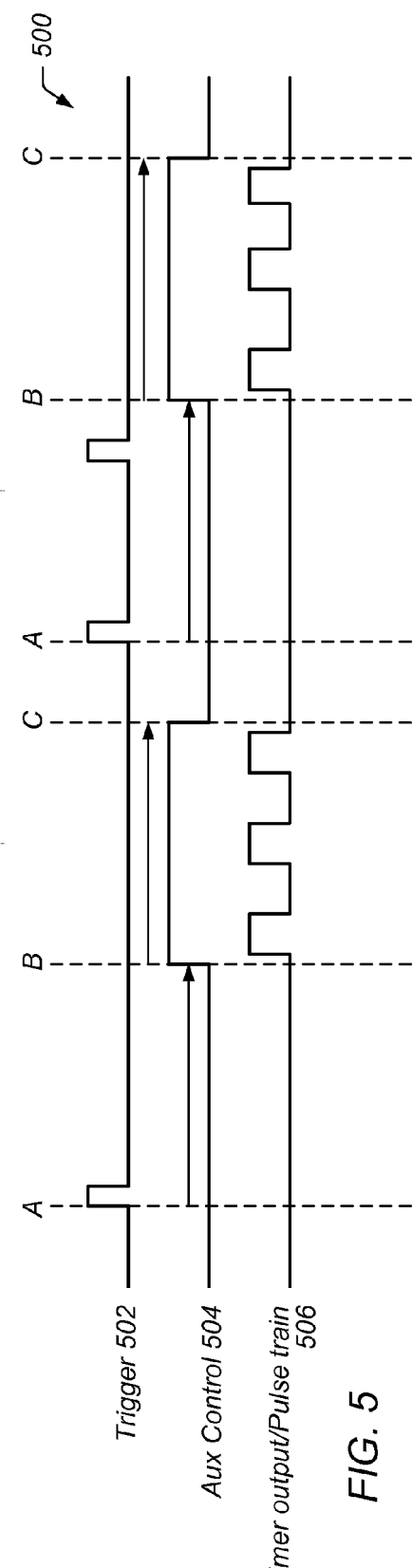
FIG. 5 shows a timing diagram of a finite pulse train generated using one embodiment of an integrated counter module.

One example of generating a finite pulse train is shown in timing diagram 500 in FIG. 5. As shown, a trigger signal 502 may be used to provide trigger pulses, based on which output pulse train 506 may be generated as timer output 370. Once a trigger pulse at time point 'A' has been generated, main counter 338 may count a specified number of pulses of the timer, which may end at time point 'B', then begin counting a specified number of TC events generated by aux counter 340, which may end at time point 'C'. In this case, finite pulse train 506 may be based on the AuxTC output of aux counter 340 and the MainTC output of main counter 338, both of which may further be shaped to generate timer output 370. In the example shown in FIG. 5, main counter 338 will have counted a total of six TC events/pulses generated by aux counter 340 on its AuxTC output, which also correspond to the three pulses generated as part of pulse train 506. As also shown in FIG. 5, any additional trigger pulses issued during the initial count period (when main counter 338 is counting timer pulses) may not affect pulse train 506. Aux control signal 504 corresponds to a shaped control signal received by aux counter 340, and may originate from aux control block 346. It should be noted that counter module 300 may equally be configured to have aux counter 340 provide the gating signal, and main counter 338 generate the pulse train. In that case, aux counter 340 may be configured to count timer pulses from the trigger pulse until the start of the pulse train, then count TC pulses of main counter 338.

In another set of embodiments, a finite pulse train may be generated by providing a stream of data that defines the low and high times of the pulses, to one counter (e.g. to main counter 338, via DMA 308 and FIFO 310), while aux counter 340 is counting the number of transitions of the output (in this case the output of main counter 338), which may correspond to the number of TC events of main counter 338. Aux counter 340 may stop/pause the operation when all the required points have been generated. Since all the data for the pulse train may be included in the data stream (instead of being static as in the case described above), a sequence of low time to high time may be desired. The first low time may be interpreted as the time from the trigger to the start of pulse train, while all subsequent low times may be interpreted as the time elapsed between high pulses. This implementation may provide more flexibility than a static implementation. It may also be possible to emulate the static implementation by providing a constant data stream. However, this may require more resources from the system, such as bandwidth of the data bus, and additional host memory and processor time. One example of possible pulse train that may be generated by providing a data stream to main counter 338 is shown in FIG. 7. As shown, pulse train 702 may feature a change in pulse specifications on each event of the output signal, resulting in a different duration for each low period and high period of pulse train 702.

Finite PWM Generation

Pulse trains may also be used to carry encoded signals through Pulse Width Modulation (PWM). In the case of PWM, the information may be carried on the pulse width, or duty cycle (the ratio of high time to the period of the signal). A signal with a constant pulse-width specification may be dynamic in time while representing a constant encoded data point. A counter generating a PWM signal would be capable of generating a particular pulse specification for a specific period of time. For generating a sequence of PWM data points, the counter may need to be capable of generating each pulse specification for the specified period of time. At the end of the operation, it may be desirable for the counter to maintain the last PWM value "constant" in its output until either the operation is stopped, or more data is provided and a new operation is started.

In one set of embodiments, main counter 338 may be configured to generate an output according to the data specified by a data stream, which may be provided to main counter 338 though DMA 308 and FIFO 310. Each data point in the data stream may represent a set of pulse specifications that define one PWM data point (i.e. the time for which the signal will remain low and the time for which the signal will remain high). Main counter 338 may generate this waveform until a pulse on a counter terminal (e.g. a sample clock) indicates that the pulse specifications may need to be switched. Main counter 338 may then switch to the next data point in the stream. Meanwhile, aux counter 340 may count the number of times the main counter switches to a new PWM spec. Aux counter 340 may pause the switching function when the desired number of PWM points have been generated, but may allow main counter 338 to continue generating the last PWM data point. This operation may be trigger controlled, in which case the pulses that appear on the sample clock before the start trigger is received may be ignored. Main counter 338 may generate its initial PWM state continuously. After the start trigger, any sample clock may cause a switch to the next specified PWM state, until the desired number of changes has been generated. At that point, the operation may either be stopped, or re-triggered for a new sequence of PWM changes.

The PWM pulse train may therefore be considered finite in at least two ways. It may be finite in overall duration based on a desired length, similar to a regular finite pulse train, or it may be finite with respect to the number of changes to the PWM pulse train specification in the data stream. In other words, the number of times the specification of the PWM pulse train changes may be specified, and each change counted (as described above), whereupon once the specified number of changes have taken place, the operation may be stopped or repeated for another sequence of changes. One example of finite PWM pulse train generation is shown in FIG. 8. The example in FIG. 8 assumes that a start trigger has already been received, and does not show the trigger signal. Waveform 802 represents the sample clock signal, and at each sample clock signal the PWM pulse train 804 may change based on a new set of specifications. Accordingly, PWM signal 804 is different following the first sample clock, second sample clock, etc. After the number of changes has reached the specified value, PWM signal may simply remain at its current setting, or generation of PWM signal 804 may be re-triggered.

Frequency Measurement

Frequency of a given signal may be measured using a reciprocal frequency measurement technique (RFM), which may require two counters in order to measure the period of an incoming signal. The three different measurement methods may be used to perform RFM: (1) inverse period measurement, (2) a count of the number of pulses during a known time period, and (3) a measure of time of a known number of cycles.

Inverse Period Measurement

The period of the signal of interest may be measured by counting the rising or falling edges of a known source frequency between the two consecutive rising or falling edges of the unknown frequency. The unknown period of the signal of interest may be calculated by taking the frequency of the known source and dividing by the count. This type of measurement may be suitable for low frequency measurement.

Counting Number of Pulses in Known Time

Inverse period measurement works well as long as the frequency of the signal of interest is significantly lower than the known source frequency. As the frequency of the signal of interest (for which the frequency is to be measured) increases, it may begin to approach the source frequency, which may lead to measurement errors. To improve the accuracy of the frequency measurement for signals of interest having a higher frequency, the number of pulses in a known time period may be counted. In this configuration, the counter may count the number of pulses of the signal of interest during a known time period associated with a lower frequency known signal (e.g. during a period of the known signal). The frequency may then be calculated by multiplying the count by the frequency of the known signal. By using two counters, a more accurate frequency measurement may be obtained for higher frequencies. The larger the period of the known signal, the smaller the measurement error.

Measuring Time of Known Number of Cycles

The inverse period measurement method may suitable for low frequency measurements, while counting the number of pulses in known time may achieve higher accuracy with higher frequency signals. However, some applications may call for measuring a pulse width modulated signal, where the frequency range of the PWM signal may cover both low and high frequencies. Similar to counting number of pulses in known time, two counters may be used to measure the time of a known number of cycles. A first counter may be used to divide down the frequency of the signal of interest (i.e. the signal to be measured), while a second counter may be used to measure the period of the divided down frequency. The actual frequency of the signal of interest may be calculated by multiplying the resulting frequency measurement by the divide down value. With this frequency method, the measurement result becomes more accurate as the divide down value becomes larger, lowering the resulting divided down frequency.

RFM Using Counter Module 300

Figure 6:
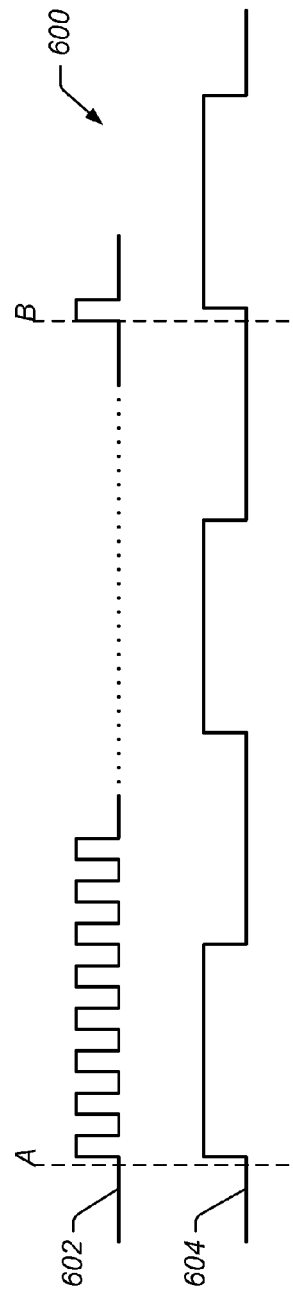
FIG. 6 shows a timing diagram of measuring the frequency of a signal using one embodiment of an integrated counter module.

In one set of embodiments, counter module 300 may be used to count the number (N) of pulses in a sampling interval of an input signal of interest, as well as measure precisely the time elapsed on those N periods of the input signal. One example of this is shown in FIG. 6, where the number of pulses (N) of input signal 604 may be counted during the time period elapsed between time points 'A' and 'B', and the time elapsed during time points 'A' and 'B' may be precisely measured by counting a number of pulses (M) of signal 602—which has a known frequency—between time points 'A' and 'B'. Having main counter 338 and aux counter 340 within the same logic control may facilitate precisely starting/stopping the time measuring counter at the boundaries of the N periods of the input signal. For example, main counter 338 may be used for counting the pulses of signal 602, and aux counter 340 may be used for counting the pulses of input signal (of interest) 604. For this measurement to be precise, both counters may need to be started and stopped precisely at time points 'A' and 'B', which main counter 338 and aux counter 340 may be configured to do. Once the sampling interval has been finalized, i.e. the counting has stopped, each counter may output its count value (referring to FIG. 3, MainCount by main counter 338 and AuxCount by aux counter 340), the count values indicative of the respective number of pulses counted (M and N).

The frequency may then be determined by dividing N by the measured time. Referring again to FIG. 6, the measured time using signal 602 (with the known frequency) may be divided by the number of pulses of signal 604 that have occurred between time points 'A' and 'B'. The sampling interval (between 'A' and 'B') may be defined by a sample clock signal, where the sample clock may signal the beginning and end of a sampling interval. In other words, the sampling clock signal may be asserted at time point 'A', and then again at time point 'B'. The sample clock signal may have arbitrary timing and may be received as a HW generated signal or as a signal generated from SW commands. Once each counter has been started in response to the sample clock signal, it may wait for the next opportunity to start the first measurement interval. This may be the next rising or falling edge of the input signal, where the choice of rising edge or falling edge may be programmable. For example, counting may begin on the first rising edge of signal 604 following time point 'A'. Each counter may then keep a running tally of the number of periods and the time from the start of the measurement. When a sample clock is received, each counter may finalize the sampling interval, start a new interval and save the measurement data.

Finalizing the sampling interval may include waiting for the same event that started the sampling interval (e.g. rising or falling edge of the input signal, as programmed). This wait period may therefore be as long as one period of the input signal. At this point, data including all the periods of the input signal defined by the sampling interval may be saved. Starting a new interval measurement may include clearing the counters and starting the periods and time counts again. Counter module 300 may be programmed in one of two modes for saving data. In a first mode, referred to as normal mode, main counter 338 and aux counter 340 may return the data saved at the end of the sampling interval. While this may provide an accurate measurement, the user may have to wait up to one period of the input signal (i.e. the signal of interest for which the frequency is to be determined) before receiving the measurement. This may be more applicable to non-real-time applications. In a second mode, referred to as low latency mode, main counter 338 and aux counter 340 may return the measurements excluding the period of the input signal in progress when the sample clock arrives. For example, when time point 'B' in FIG. 6 occurs before the current period of signal 604 ends. This measurement may not provide the precision that may be obtained in the normal mode, but it has the advantage of having a small and deterministic latency.

Frequency measurement modes supported by counter module 300 may include buffered operation, SW timed or single point operation, user selected duration of the measurement via control of the sample clock period, support for synchronized measurement with other timed events, low latency measurements, return of the last completed measurement.

Double Event Counting

In one set of embodiments, aux counter 340 and Main counter 338 may be configured to perform coherent dual event counting, in which events may be counted on two different signals, and both count values may be saved when a sample clock event occurs.

Position and Event Counting

In one set of embodiments, main counter 338 may be programmed to interface to a position measurement device (such as a quadrature encoder), and aux counter 340 may be programmed to count events on another input signal. On a sample clock event, each counter may save the position data as well as the event counts in a coherent manner.

Method for Reprogramming a Counter Based on a Stream of Data

Reprogramming a counter, e.g. main counter 338 using a stream of data (e.g. during variable finite pulse train generation and finite PWM generation), may also enable continuous modes of operation that may not require aux counter 340. Main counter 338 may be configured to receive a stream of data that contains basic commands for main counter 338 to execute. In case of variable pulse generation, the stream data (or data stream) may include information specifying the time the counter should keep the output low, and the time the counter should keep the output high. Each data in the data stream may be executed once and then discarded (see again FIG. 7, for example). In the case of PWM generation, each pair of data points may represent a command of high/low time for the counter. The counter may repeat this command until it is indicated by a sample clock event to switch to the next command in the stream. Other commands or interpretation of the commands may also be added. One example of a possible addition is a command that includes data for aux counter 340 to control how many times a high/low pulse is executed.

Coupling a Timing Engine with Counter Operations Using the Sample Clock

Several counter/timer operations may require a sample clock input. This input may be used to define measurement intervals (for example, when performing frequency measurements, as described above), or to command the counter/timer module 300 to perform an action (for example, in PWM generation, to switch to the next data point). In other measurement types, a timing device, referred to herein as a timing engine may be responsible for generating and managing the sample clocks. A timing engine may include a set of counters and state machines configured to generate the sample clocks for finite, continuous, pre-trigger (a first specified period before and a second specified period after the trigger), pause sample clocks etc. In most embodiments, the timing engine may be capable of generating more than just a free running pulse train, (i.e. it may include more functionality than the functionality of a counter generating a pulse train).

The functions of the timing engine may include the following: Accepting a start trigger, which may define a moment in time after which sample clocks may be accepted or generated; Accepting a reference trigger, which may define a number of samples to acquire before and after the trigger; Synchronizing multiple measurements; Generating a sample clock with specified period and delays from triggers; Counting the number of acquired samples, allowing finite acquisitions, and generating/accepting the right number of sample clocks. In one set of embodiments, a timing engine that supports those basic functions may be coupled to counter module 300 to combine with the counter operations performed by counter module 300.

The sample clock may provide the same functionality to counter operations than what it provides to other measurement types (such as analog inputs). The sample clock may also be part of the counter logic (i.e. it may be incorporated into counter module 300), or it may be external to counter module 300 and coupled to counter module 300 as needed. The timing engine may provide the sample clocks to counter/timer module 300, and counter/timer module 300 may provide a signal indicating an "end of conversion" event (EOC), which may enable the timing engine to detect when the sample clock is too fast for the programmed measurement, and may report an error. In one set of embodiments, the timing engine (not shown in FIG. 3) may be external to counter module 300, and may include its own counters, control logic, triggers, etc., which may be coupled to counter module 300. In another set of embodiments, the timing engine (again, not shown) may be included in counter module 300, and dedicated to generate sample clocks at regular intervals, and to accept start/reference/pause triggers to control the generation of such sample clocks.

Method for Synchronizing to Asynchronous External Sources

Oftentimes counter/timer modules may need to operate according to an externally provided clock source. One example of when an external clock source may be provided is the generation of a divided version of an input signal with low jitter. The problem with externally provided sources is that they are typically not reliable. Most DAQ applications include several operations that are time critical, and could not wait for the presence of an external clock, including, for example, the generation of interrupts to the host or responding to a read request from the host.

The operation of a circuit running on an external source may be emulated with a faster, internal clock source. This emulation may include synchronous detection of a rising or falling edge (whether to act on the rising or the falling edge may be programmable), and acting on that detection event. One advantage of this approach is running the counter on an internal, reliable clock, where the clock may be used to define synchronous circuits to perform time critical operations. All such circuits may be readily analyzed with off-the-shelf timing analysis tools, and may be simpler to validate and maintain than their asynchronous counterparts. For input tasks, such as measuring edges of a signal, this approach may be indistinguishable from the counter running according to an external source. However, for output operations, such as dividing an external signal, the emulation may not be transparent because the synchronization of the signal may introduce an uncertainty (or jitter) related to the asynchronous nature or the external signal with respect to the internal faster clock source. This jitter may have a value of up to ±1 clock period of the internal timebase.

In one set of embodiments, a re-synchronization stage may be added back to the original external source to remove this jitter. This may facilitate the use of the synchronous circuits used in emulation mode, and may localize the complexity of working with two asynchronous signals to a single circuit path. In one embodiment, synchronization to the original source may be accomplished with the internal, faster clock running a specified number of times, e.g. four times faster than the external signal.

Figure 9:
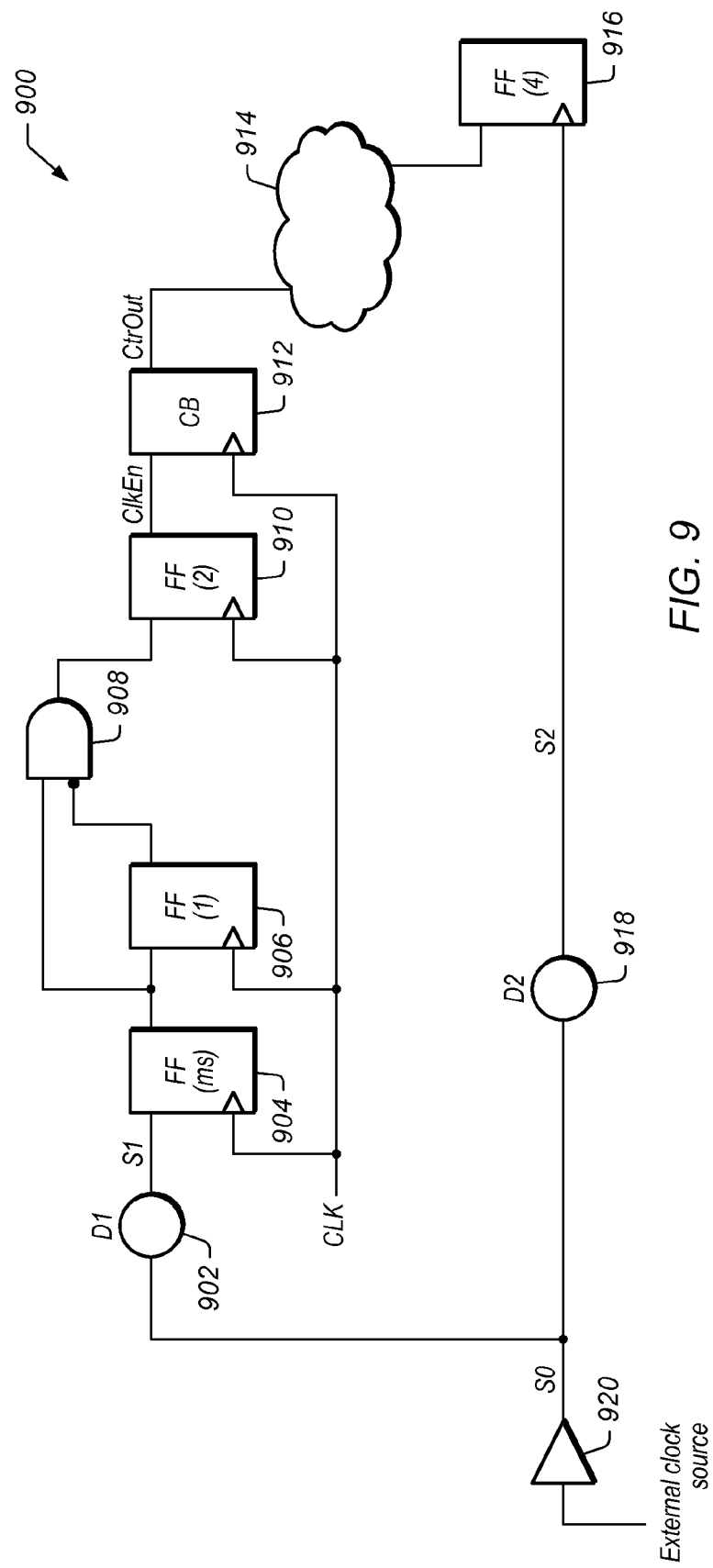
FIG. 9 shows one embodiment of a re-synchronization circuit to emulate the operation of a circuit running on an external clock source with a faster internal clock source.
Figure 10:
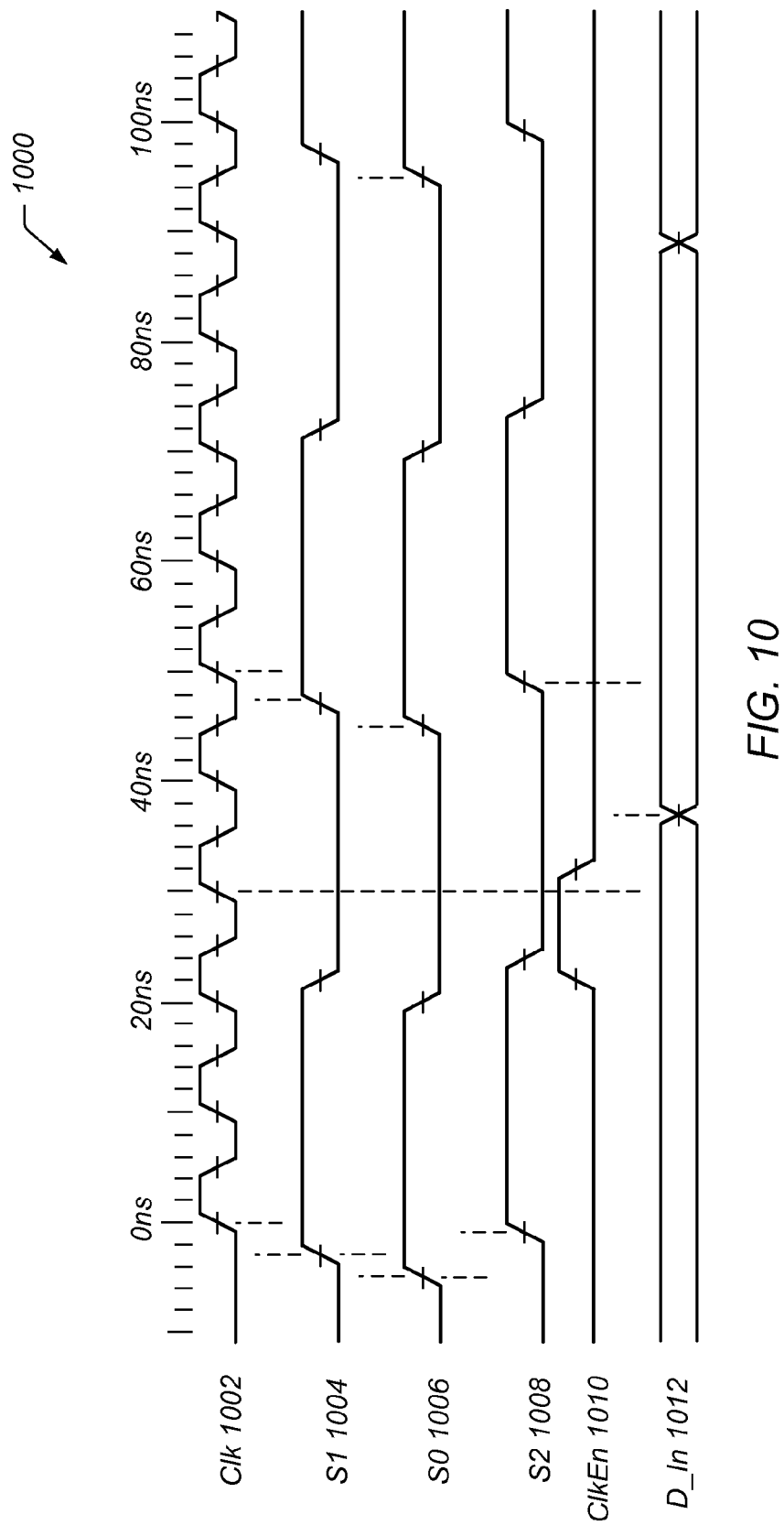
FIG. 10 shows a timing diagram of the operation of the circuit of FIG. 9 for minimum setup time.
Figure 11:
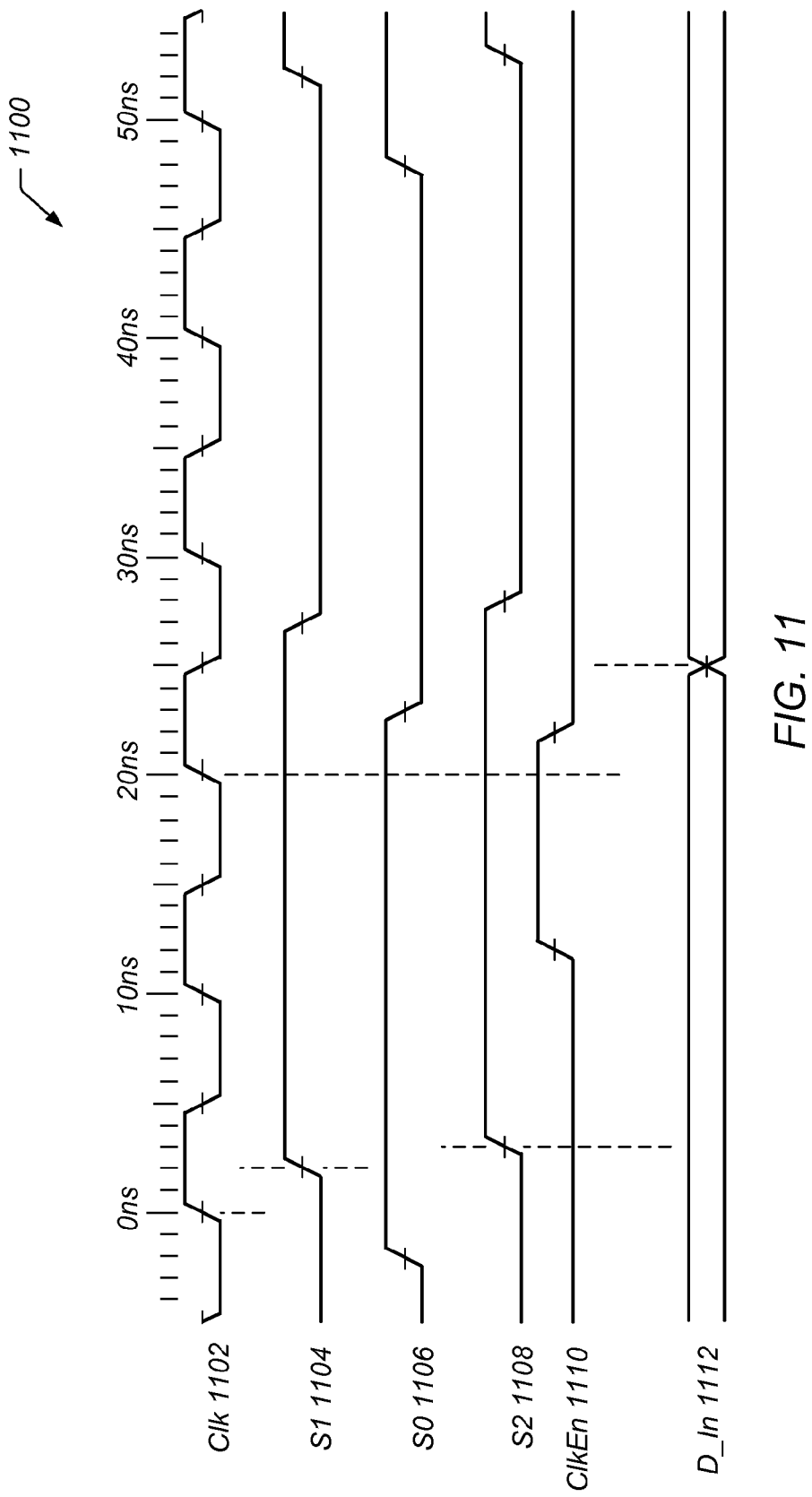
FIG. 11 shows a timing diagram of the operation of the circuit of FIG. 9 for minimum hold time.

One embodiment of a re-synchronization circuit 300 to emulate the operation of a circuit running on an external clock source with a faster internal clock source is shown in FIG. 9. In one set of embodiments, resynchronization circuit 300 may be a part of output control module 350 of counter 300. The resynchronization technique may therefore provide a way of shaping the output of the counter (i.e. timer outputs 370) to remove the jitter when emulating running from an external timebase. S0 shows the input path for the external clock source. The external clock source may be provided to flip-flop (FF) 904 and FF 906 for synchronization and synchronous edge detection in the faster clock domain (CLK). An enable signal (ClkEn) may be generated from FFs 904 and 906, through AND function 908 and FF 910. ClkEn may be used to activate logic running on the CLK domain, shown in circuit 900 as CB (counter block) 912, which in this case may be the counter itself, e.g. counter module 300, and its associated logic. The output (CtrOut) of CB 912 may then be provided to FF 916, which may be a flip-flop running on the external clock source. The external clock signal (external clock source) and the internal faster clock (CLK) may be asynchronous with respect to each other. Normally, this would make receiving a signal from the CLK domain into the external clock domain unreliable. However, at least two properties of circuit 900 ensure that receiving a signal from the CLK domain into the external clock domain remains reliable. The first property is the circuit detecting the rising edge of the signal at S0 and using the detection to enable the logic running on the CLK signal. The second property is the frequency of S0 (shown as the external clock source run through a buffer 920) being ¼ or less of the frequency of the CLK signal. These two properties may facilitate changing the input to FF 916 when there is no activity on S0, and with proper timing analysis, ensuring that the data will be received correctly on the next clock cycle of S0.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A counter module comprising:
   a first set of registers configured to store respective sets of first control data;
   a second set of registers configured to store respective sets of second control data;
   a first counter coupled to the first set of registers and configured to:
      receive counter input signals and an internal control signal; and
      generate a first count output and a first terminal count output according to one of the respective sets of the first control data, the internal control signal, and the counter input signals;
   a second counter coupled to the first counter and to the second set of registers, and configured to:
      receive the counter input signals;
      generate a second count output and a second terminal count output according to one of the respective sets of the second control data and the counter input signals; and
   output control logic configured to generate a timer output based on one or more of:

the first terminal count output; or
the second terminal count output;
wherein the internal control signal is based on the second terminal count output.

2. The counter module of claim 1;
wherein the first set of registers are arranged in first register banks, each register bank of the first register banks comprising two respective load registers of the first set of registers;
wherein a first register bank of the first register banks is configured to be written while the first counter is accessing one of two other register banks of the first register banks;
wherein the first counter is further configured to access one of the two other register banks of the first register banks at a time to obtain the one of the respective sets of the first control data;
wherein the second set of registers are arranged in second register banks, each register bank of the second register banks comprising two respective load registers of the second set of registers;
wherein a first register bank of the second register banks is configured to be written while the second counter is accessing one of two other register banks of the second register banks; and
wherein the second counter is further configured to access one of the two other register banks of the second register banks at a time to obtain the one of the respective sets of the second control data.

3. The counter module of claim 1;
wherein each respective set of the first control data comprises:
a respective first value indicative of a first time period before a first pulse of the first terminal count output; and
a respective second value indicative of a second time period before a second pulse of the first terminal count output; and
wherein each respective set of the second control data comprises:
a respective third value indicative of a third time period before a first pulse of the second terminal count output; and
a respective fourth value indicative of a fourth time period before a second pulse of the second terminal count output.

4. The counter module of claim 1, further comprising:
a data stream delivery circuit configured to deliver a control data stream to the first counter;
wherein the first counter is configured to generate the first count output and the first terminal count output according to:
data received through the control data stream;
the internal control signal; and
the counter input signals.

5. The counter module of claim 4, wherein the data stream delivery circuit comprises:
a direct memory access (DMA) module configured to transfer the control data stream; and
a first-in-first-out buffer coupled to the DMA module and to the first counter, and configured to buffer the data received through the control data stream.

6. The counter module of claim 4, wherein the control data stream comprises data points indicative of respective low time periods during which the timer output should be low and respective high time periods during which the timer output should be high;
wherein the first counter is configured to generate the first terminal count output according to the data points; and
wherein the second counter is configured to count the number of pulses in the first terminal count output, and instruct the first counter to stop generating the first terminal count output when a desired number of data points have been used.

7. The counter module of claim 4, wherein control data stream comprises data points, wherein each data point is indicative of:
a respective low time period during which the timer output should be low; and
a respective high time period during which the timer output should be high;
wherein the first counter is configured to:
generate the first terminal count output according to a current data point of the data points; and
update the current data point with values of a next one of the data points when instructed by a control signal of the counter input signals;
wherein the second counter is configured to count the number of times the first counter updates the current data point, and instruct the first counter to stop updating the current data point when the first counter has updated the current data point a desired number of times.

8. The counter module of claim 1, further comprising:
a control block configured to coordinate operation of the first counter and the second counter.

9. The counter module of claim 8, wherein in coordinating operation of the first counter and the second counter, the control block is configured decode the counter input signals into appropriate control signals for each of the first counter and the second counter in a synchronized manner.

10. The counter module of claim 1, wherein the timer output is a pulse train;
wherein the first counter is configured to control generation of the pulse train by counting:
the number of pulses of a timer signal of the counter input signals from a starting point indicated by a trigger signal to a starting point of the pulse train defined by the one of the respective sets of the first control data; and
the number of pulses in the second terminal count output from the starting point of the pulse train to an ending point of the pulse train defined by the one of the respective sets of the first control data.

11. The counter module of claim 1;
wherein the first counter is configured to count the number (N) of pulses of a first signal of unknown frequency within a specified first time period, and output as the first count output a first count value indicative of N;
wherein the second counter is configured to count the number (M) of pulses of a second signal of known frequency within the specified time period, and output as the second count output a second count value indicative of M;
wherein the first counter and the second counter are configured to:
both begin counting at a same first point in time based on a beginning of the specified first time period; and
both stop counting at a same second point in time based on an end of the specified first time period.

12. The counter module of claim 11, wherein the specified time period is defined by a sample clock signal.

13. The counter module of claim 12, wherein the sample clock signal is provided by one of:
hardware external to the counter module;
hardware configured within the counter module; or software executing on a system comprising the counter module.

14. The counter module of claim 11;
wherein the first point in time is defined by one of:
a rising edge of the first signal subsequent to the beginning of the specified first time period; or
a falling edge of the first signal subsequent to the beginning of the specified first time period; and
wherein the second point in time is defined by one of:
a rising edge of the first signal subsequent to the end of the specified first time period; or
a falling edge of the first signal subsequent to the end of the specified first time period.

15. The counter module of claim 11, wherein the second point in time is defined by one of:
a rising edge of the first signal immediately preceding the end of the specified first time period; or
a falling edge of the first signal immediately preceding the end of the specified first time period.

16. The counter module of claim 1, wherein the output control logic comprises a resynchronization circuit configured to emulate operation of a circuit running on an external clock source, with a faster internal clock source.

17. A counter module comprising:
a first set of registers configured to store respective sets of first control data;
a second set of registers configured to store respective sets of second control data;
a first counter coupled to the first set of registers and configured to:
receive counter input signals and a first internal control signal; and
generate a first count output and a first terminal count output according to one of the respective sets of the first control data, the first internal control signal, and the counter input signals;
a second counter coupled to the first counter and to the second set of registers, and configured to:
receive the counter input signals and a second internal control signal;
generate a second count output and a second terminal count output according to one of the respective sets of the second control data, the second internal control signal, and the counter input signals; and
output control logic configured to generate a timer output based on one or more of:
the first terminal count output; or
the second terminal count output;
wherein the first control signal is based on the second terminal count output, and the second control signal is based on the first terminal count output.

18. The counter module of claim 17, further comprising:
a data stream delivery circuit configured to deliver a control data stream to the first counter and the second counter;
wherein the first counter is configured to generate the first count output and the first terminal count output according to:
first data received through the control data stream;
the first internal control signal; and
the counter input signals; and
wherein the second counter is configured to generate the second count output and the second terminal count output according to:
second data received through the control data stream;
the second internal control signal; and
the counter input signals.

19. The counter module of claim 18, wherein the data stream delivery circuit comprises:
a direct memory access (DMA) module configured to transfer the control data stream; and
a first-in-first-out (FIFO) buffer coupled to the DMA module, to the first counter, and to the second counter, and configured to buffer the first data and second data received through the control data stream.

20. The counter module of claim 19, further comprising a selection circuit coupled between the FIFO buffer and the first counter, and between the FIFO buffer and the second counter, to route the first data to the first counter and the second data to the second counter.

* * * * *